(12) United States Patent
Seon et al.

(10) Patent No.: US 9,070,826 B2
(45) Date of Patent: Jun. 30, 2015

(54) ACCUMULATED TYPE THERMOELECTRIC GENERATOR FOR VEHICLE

(71) Applicant: Hyundai Motor Company, Seoul (KR)

(72) Inventors: Jong-Ho Seon, Incheon (KR); Ho-Chan An, Gyeonggi-do (KR)

(73) Assignee: Hyundai Motor Company, Seoul (KR)

( * ) Notice: Subject to any disclaimer, the term of this patent is extended or adjusted under 35 U.S.C. 154(b) by 92 days.

(21) Appl. No.: 13/912,524

(22) Filed: Jun. 7, 2013

(65) Prior Publication Data
US 2014/0182649 A1   Jul. 3, 2014

(30) Foreign Application Priority Data
Dec. 31, 2012   (KR) .................. 10-2012-0158125

(51) Int. Cl.
| | |
|---|---|
| *F01N 3/00* | (2006.01) |
| *F01N 3/02* | (2006.01) |
| *F01N 3/10* | (2006.01) |
| *F01N 3/20* | (2006.01) |
| *H01L 35/32* | (2006.01) |

(52) U.S. Cl.
CPC .............. *H01L 35/32* (2013.01); *Y02T 10/16* (2013.01); *Y02T 10/166* (2013.01)

(58) Field of Classification Search
USPC .......................................... 60/320, 323, 324
See application file for complete search history.

(56) References Cited

U.S. PATENT DOCUMENTS

| | | | |
|---|---|---|---|
| 2006/0053771 A1* | 3/2006 | Murata ........................ | 60/285 |
| 2011/0120106 A1* | 5/2011 | Bruck et al. .................. | 60/320 |
| 2011/0131961 A1* | 6/2011 | Lee et al. ..................... | 60/320 |
| 2011/0214413 A1* | 9/2011 | Hodgson et al. ............. | 60/274 |

FOREIGN PATENT DOCUMENTS

| | | |
|---|---|---|
| JP | 2005260155 A | 9/2005 |
| KR | 2002-0037964 A | 5/2002 |
| KR | 10-2006-0066046 | 6/2006 |

* cited by examiner

*Primary Examiner* — Audrey K Bradley
*Assistant Examiner* — Dapinder Singh
(74) *Attorney, Agent, or Firm* — Mintz Levin Cohn Ferris Glovsky and Popeo, P.C.; Peter F. Corless

(57) ABSTRACT

In one embodiment, a thermoelectric generator for a vehicle is provided. In particular, a thermoelectric generator is provided that includes a thermoelectric generating unit which is mounted between an exhaust gas inlet pipe through which an exhaust gas flows within and an exhaust gas outlet pipe through which the exhaust gas is discharged. The thermoelectric generating unit also includes a coolant inlet formed on one side thereof and a coolant outlet formed on the other side. More specifically, the thermoelectric generator is formed by assembling a plurality of unit modules which each have thermoelectric elements.

6 Claims, 5 Drawing Sheets

ACCUMULATED TYPE THERMOELECTRIC GENERATOR FOR VEHICLE

CROSS-REFERENCE TO RELATED APPLICATIONS

This application claims priority under 35 U.S.C. §119 to Korean Patent Application No. 10-2012-0158125, filed on Dec. 31, 2012, in the Korean Intellectual Property Office, the disclosure of which is incorporated herein by reference in its entirety.

BACKGROUND OF THE INVENTION

1. Field of the Invention

The present invention relates to a thermoelectric generator for a vehicle, and more particularly, to a thermoelectric generator for a vehicle including a thermoelectric generating unit which is mounted between an exhaust gas inlet pipe through which an exhaust gas flows in and an exhaust gas outlet pipe through which the exhaust gas is discharged, has a coolant inlet formed on one side and a coolant outlet formed on the other side thereof, and is formed by assembling a plurality of unit modules each having thermoelectric elements.

2. Description of the Related Art

In general, a thermoelectric generator refers to an apparatus which obtains electrical energy by using a potential difference generated between a heating element and a cooling element when a temperature difference is applied to both ends of the heating element and the cooling element. Typically, the heating and cooling element are made of metals or semiconductors. As such, heat may be directly converted into electricity without mechanical operations.

Thermoelectric generator are often applied to exhaust gas equipment of industrial boilers, and power supply facilities in remote areas, and in recent years, they have begun to be applied to waste heat utilization systems for waste incinerators, geothermal power generation, ocean temperature difference power generation, or the like.

Meanwhile, since the efficiency of an engine driving alternating current generator (also called an alternator), which supplies electrical power within a vehicle to charge the battery, is only operating at about 33% efficiency, and the shaft power of the alternator should be increased as electric power consumption of the vehicle is increased, as the loss of the shaft power is increased, fuel consumption becomes increases, and an increase of pollutants are discharged due to the high fuel consumption.

The amount of energy that is required to operate the alternator changes based on a driving state of the vehicle and the amount of electrical power being consumed by the vehicle. Therefore, thermoelectric generators which collect exhaust heat from an engine have begun to be added to vehicles.

The thermoelectric generator in a vehicle typically includes a heating unit for performing heat exchange/transfer between the exhaust gas and a high temperature end of a thermoelectric module. This thermoelectric module often includes a plurality of thermoelectric semiconductors, a cooling unit for cooling a low temperature end of the thermoelectric module, and an exhaust heat recovery apparatus. The thermoelectric generator converts thermal energy, which is obtained from exhaust heat of the engine, into electric energy.

FIG. 1 is a schematic view illustrating a concept of a thermoelectric module used in a thermoelectric generator. A thermoelectric module is a circuit manufactured so that an electric current flows by thermoelectromotive force generated by connecting p-type and n-type conductors or semiconductors and setting a high temperature heat source at one side and a low temperature heat source at the other side. Typically, each thermoelectric module may output about 2 W to 4 W.

However, it is necessary to maximize a temperature difference between the heating unit and the cooling unit to increase the amount of power generated by the thermoelectric module, but because the structural efficiency of the heating unit and the cooling unit is currently poor in the thermoelectric generator for a vehicle of the related art like the one shown in FIG. 1, the temperature difference between the high temperature end and the low temperature end is smaller than what is desirable.

SUMMARY OF THE INVENTION

The present invention has been made in an effort to provide an accumulated type thermoelectric generator for a vehicle capable of maximizing power generation efficiency of the thermoelectric generator by improving a heat exchange structure including a heating unit and a cooling unit.

An exemplary embodiment of the present invention provides an accumulated type thermoelectric generator for a vehicle, including a thermoelectric generating unit which is mounted between an exhaust gas inlet pipe through which an exhaust gas flows in and an exhaust gas outlet pipe through which the exhaust gas is discharged, has a coolant inlet formed on one side and a coolant outlet formed on the other side thereof, and is formed by assembling a plurality of unit modules having therein thermoelectric elements.

The accumulated type thermoelectric generator for a vehicle having the aforementioned configuration according to the exemplary embodiment of the present invention has the following effects.

First, the thermoelectric generating unit of the thermoelectric generator according to the exemplary embodiment of the present invention has a structure in which a plurality of unit modules are accumulated, thereby improving an amount of thermoelectric power generation by efficiently configuring paths of a high temperature portion and a low temperature portion in a limited space and increasing an application area of thermoelectric elements.

Second, because the thermoelectric generating unit of the thermoelectric generator according to the exemplary embodiment of the present invention is formed with a unit module as a base unit, the thermoelectric generating unit may appropriately cope with layout constraints of a vehicle chassis and a change in output amount of an engine by adjusting the number of unit modules used in the thermoelectric generating unit.

Third, in the unit module of the thermoelectric generating unit of the thermoelectric generator according to the exemplary embodiment of the present invention, since the assembly and disassembly between the unit modules is performed by a screw assembly method, the replacement for failed parts may be quickly and easily performed.

Fourth, because the unit module of the thermoelectric generating unit of the thermoelectric generator according to the exemplary embodiment of the present invention has components having the same shape and the same number of components are repeatedly assembled, a system for supplying components is simplified and maintenance is easily performed, so that the unit module is appropriate for mass production. Moreover, the structural strength of the thermoelectric generator is excellent.

DETAILED DESCRIPTION OF THE EMBODIMENTS

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, combustion, plug-in hybrid electric vehicles, hydrogen-powered vehicles and other alternative fuel vehicles (e.g. fuels derived from resources other than petroleum).

Additionally, it is understood that the below modules and units are embodied as hardware that is made up of structural components and should not be interpreted as software for the purposes of this application. Additionally, the terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Hereinafter, a configuration of an accumulated type thermoelectric generator for a vehicle according to an exemplary embodiment of the present invention will be described in detail with reference to the drawings. However, the accompanying drawings are provided as examples in order to fully transfer the spirit of the present invention to those skilled in the art. Therefore, the present invention is not limited to the accompanying drawings and may be implemented in various forms.

Further, unless terms used in the present specification are defined, they have meanings commonly understood by those skilled in the art to which the present invention pertains and known functions and configurations which may unnecessarily obscure the gist of the present invention will not be described in detail in the following description and accompanying drawings.

Figure 1:
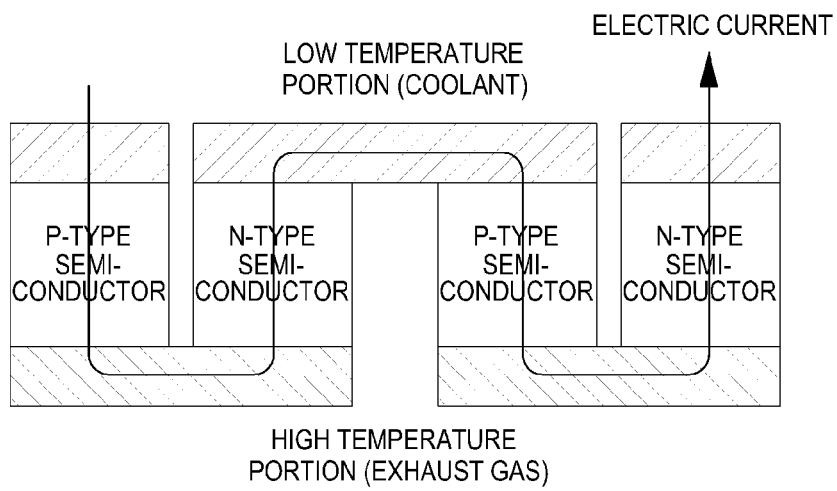
FIG. 1 is a schematic view illustrating the concept of a thermoelectric module.
Figure 2:
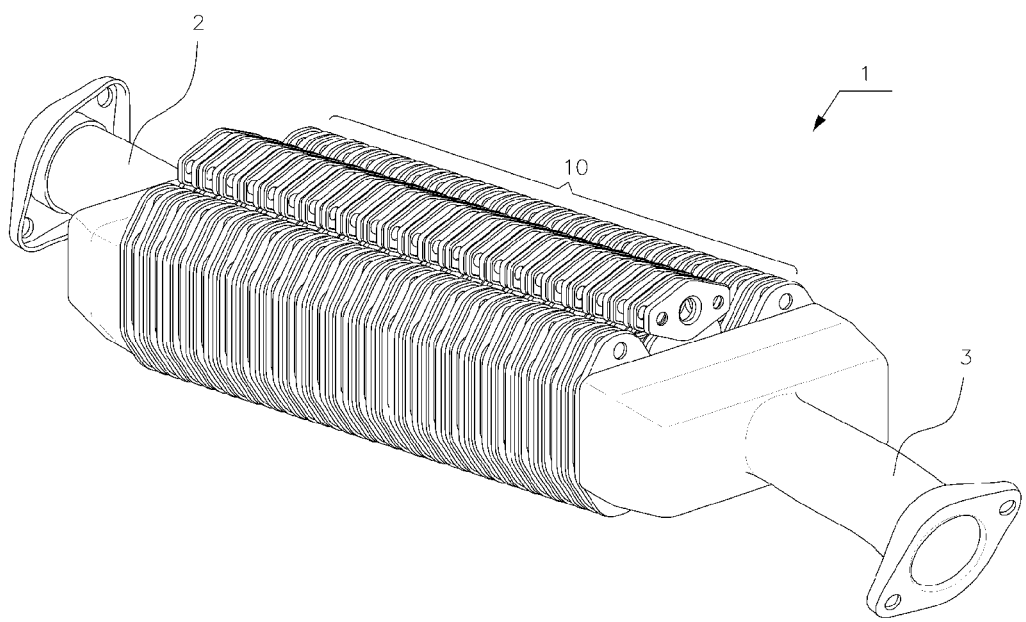
FIG. 2 is a perspective view of a thermoelectric generator according to an exemplary embodiment of the present invention.
Figure 3:
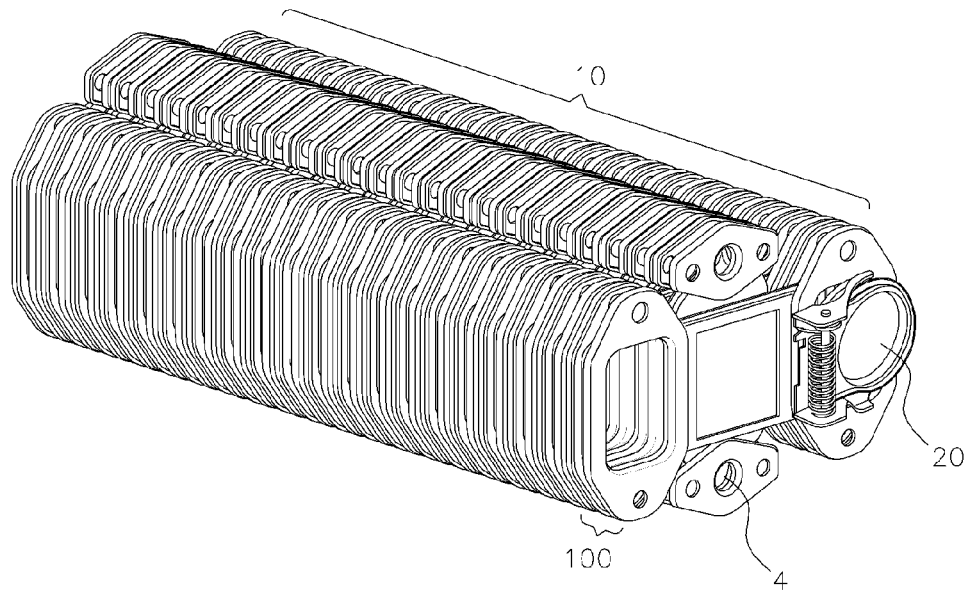
FIG. 3 is a perspective view illustrating a state in which an exhaust gas inlet and an exhaust gas outlet of the thermoelectric generator according to the exemplary embodiment of the present invention are separated.

FIG. 2 is a perspective view of a thermoelectric generator according to an exemplary embodiment of the present invention, and FIG. 3 is a perspective view illustrating a state in which an exhaust gas inlet and an exhaust gas outlet of the thermoelectric generator according to the exemplary embodiment of the present invention are separated.

Referring to FIGS. 2 and 3, a thermoelectric generator 1 according to an exemplary embodiment of the present invention includes a thermoelectric generating unit 10 mounted between an exhaust gas inlet pipe 2 through which exhaust gas flows in and an exhaust gas outlet pipe 3 through which exhaust gas is discharged.

Figure 7:
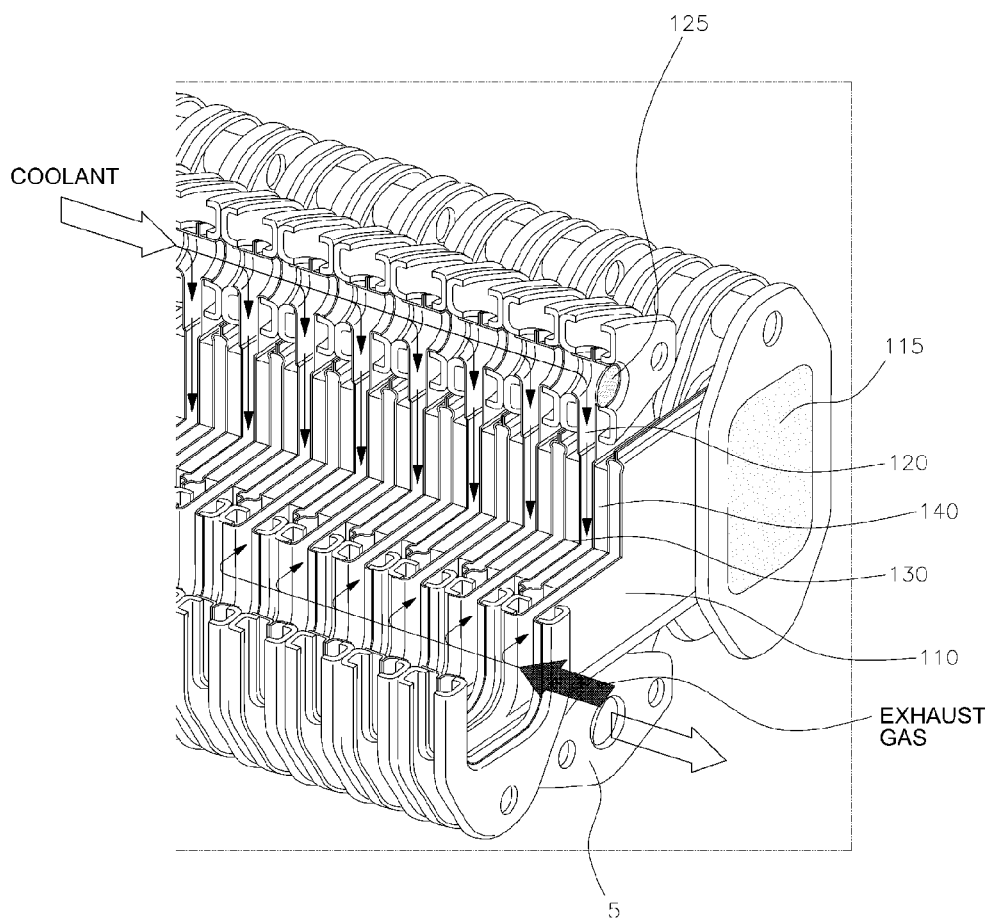
FIG. 7 is an enlarged perspective view of a partial cut portion illustrating an operation of the thermoelectric generator according to the exemplary embodiment of the present invention.

A coolant inlet 4 is formed on one side of the thermoelectric generating unit 10, and as illustrated in FIG. 7, a coolant outlet 5 is formed on the other side of the thermoelectric generating unit 10. In addition, a valve 20, which controls discharge of the exhaust gas flowing into the exhaust gas inlet pipe 2, may be attached to one side of the thermoelectric generating unit 10.

In the thermoelectric generating unit 10 according to the exemplary embodiment of the present invention, heat exchange/transfer occurs between the exhaust gas contain heat generated from an engine and cold coolant through a process in which the exhaust gas flowing into the exhaust gas inlet pipe 2 is discharged to the outside through the exhaust gas outlet pipe 3, and the coolant flows from the coolant inlet 4 to the coolant outlet 5.

Further, due to the heat exchange/transfer, a temperature difference is applied to both ends of a first thermoelectric element 130 and a second thermoelectric element 140 which may be made of metal or a semiconductor and installed in the thermoelectric generating unit 10, and thereby electric energy is generated by a potential difference generated between a heated thermoelectric element and a cooled thermoelectric element.

Figure 4:
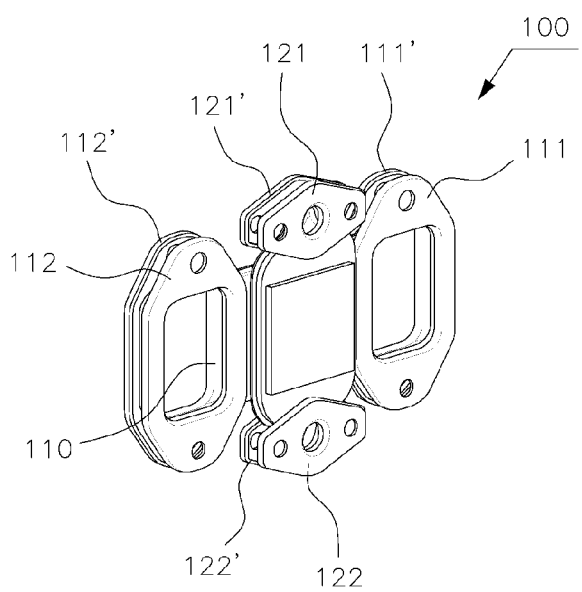
FIG. 4 is a perspective view of a unit module of the thermoelectric generator according to the exemplary embodiment of the present invention.
Figure 5:
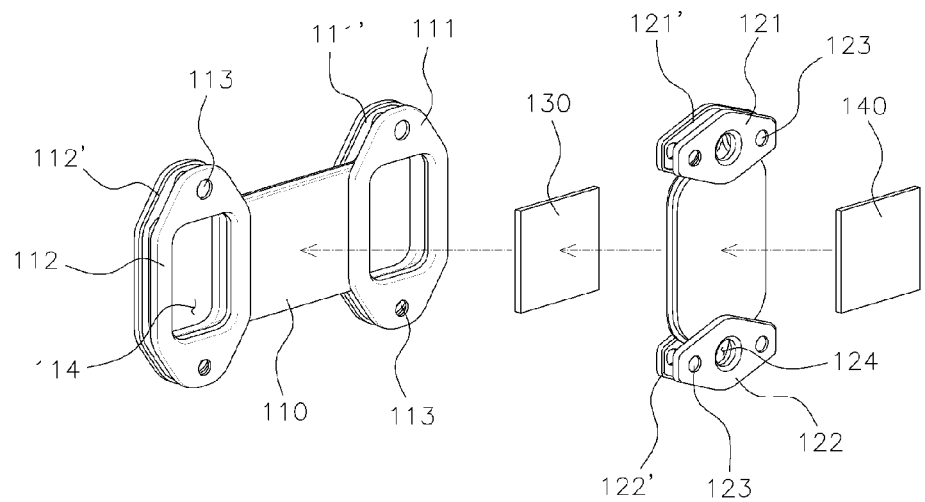
FIG. 5 is an exploded perspective view of a unit module of the thermoelectric generator according to the exemplary embodiment of the present invention.

The thermoelectric generating unit 10 according to the exemplary embodiment of the present invention is an assembly of a plurality of unit modules 100 in which the first thermoelectric element 130 and the second thermoelectric element 140 are installed, FIG. 4 is a perspective view illustrating a configuration of the unit module 100, and FIG. 5 is an exploded perspective view of the unit module 100.

Referring to FIGS. 4 and 5, the unit module 100 includes an exhaust gas flow plate 110 which allows the exhaust gas to flow into an inner space in a hollow state, and a first pair exhaust gas gaskets 111 on one side of the plate 110 and 111' and a second pair of exhaust gas gaskets 112 and 112', which have exhaust gas through apertures 114 in order to allow the exhaust gas flowing from the exhaust gas inlet pipe 2 to flow inside the exhaust gas flow plate 110, are attached at left and right sides of the exhaust gas flow plate 110, respectively.

Bolt insertion bores 113 to which fixing bolts (not illustrated) to couple one unit module 100 and another unit module 100 to each other and maintain an airtight state of the exhaust gas flow plate 110 are inserted are formed at upper ends and lower ends of the first exhaust gas gaskets 111 and 111' and the second exhaust gas gaskets 112 and 112', respectively. Further, the first thermoelectric element 130 made of a metal or a semiconductor may be attached to a surface of the exhaust gas flow plate 110.

In addition, a coolant flow plate 120, which allows the coolant to flow into the inner hollow space, is attached to a surface of the first thermoelectric element 130 which is attached to the exhaust gas flow plate 110.

Further, a first pair of coolant gaskets 121 and 121' and a second pair of coolant gaskets 122 and 122', which have coolant through apertures 124 in order to allow the coolant flowing from the coolant inlet 4 to flow inside the coolant flow plate 120, are attached at upper and lower sides of the coolant flow plate 120, respectively.

Bolt insertion apertures 124 to which fixing bolts (not illustrated) to couple one unit module 100 and another unit module 100 to each other and maintain an airtight state of the coolant flow plate 120 are inserted are formed at left and right sides of the first coolant gaskets 121 and 121' and the second coolant gaskets 122 and 122'. Likewise, the second thermoelectric element 140 made of a metal or a semiconductor is attached to a surface of the coolant flow plate 120.

Moreover, an exhaust gas blocking plate 115, which prevents the exhaust gas from flowing to the outside of the thermoelectric generating unit 10, is formed on the first exhaust gas gaskets 111 and 111' of the unit module 100 positioned outermost in a direction of the exhaust gas inlet pipe 2 of the thermoelectric generating unit 10 according to the exemplary embodiment of the present invention, and a coolant blocking plate 125, which prevents the coolant from flowing to the outside of the thermoelectric generating unit 10, is installed on the first coolant gaskets 121 and 121' positioned outermost in a direction of the exhaust gas inlet pipe 2.

Figure 6:
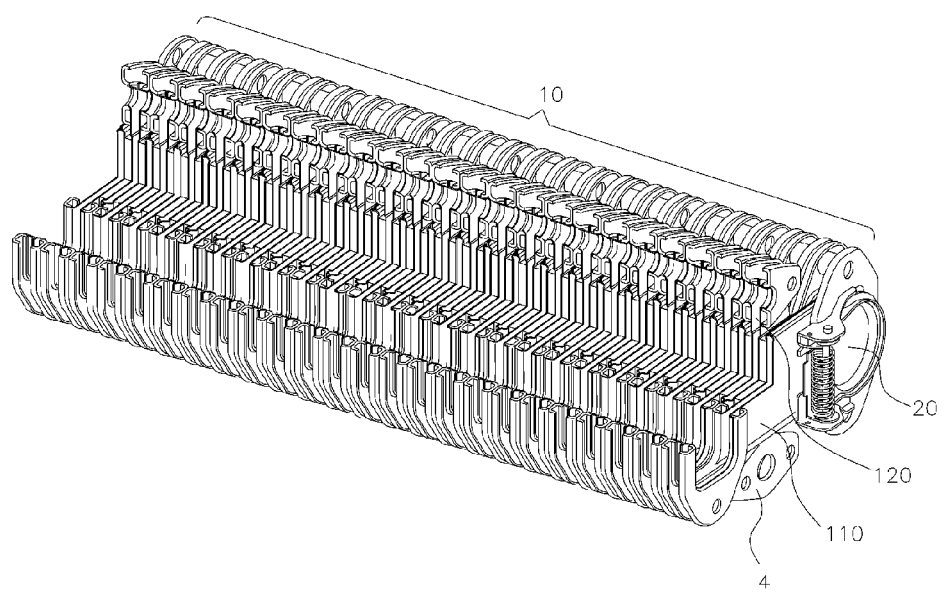
FIG. 6 is a partially cut perspective view of the thermoelectric generator according to the exemplary embodiment of the present invention.

In the unit module 100 configured as described above, as illustrated in FIG. 6 that is a partially cut perspective view of the thermoelectric generator according to the exemplary embodiment of the present invention and FIG. 7 that is an enlarged perspective view of a partial cut portion illustrating an operation of the thermoelectric generator according to the exemplary embodiment of the present invention, the exhaust gas flowing from the exhaust gas inlet pipe 2 flows in a direction of the exhaust gas outlet pipe 3 by the exhaust gas blocking plate 115. The exhaust gas flows inside the exhaust gas flow plate 110 through the exhaust gas through apertures 114 of the first exhaust gas gaskets 111 and 111' and the second exhaust gas gasket 112 and 112', and flows toward the exhaust gas outlet pipe 3 and exhaust heat of the exhaust gas flows together with the exhaust gas.

Moreover, the coolant flowing from the coolant inlet 4 flows inside the coolant flow plate 120 through a coolant through aperture 124, and then flows toward the coolant outlet 5 by the coolant blocking plate 125. Therefore, the exhaust gas, which flows inside the exhaust gas flow plate 110 in a horizontal direction and includes heat from the engine, and the coolant, which flows inside the coolant flow plate 120 in a vertical direction, are perpendicular to each other. Thus, the heat exchange/transfer which occurs between the exhaust gas of the exhaust gas flow plate 110 and the coolant of the coolant flow plate 120 is actively performed. By the active heat exchange/transfer between the exhaust gas and the coolant, a larger temperature difference is applied to both ends of the first thermoelectric element 130 and the second thermoelectric element 140, which are attached between the exhaust gas flow plate 110 and the coolant flow plate 120. Therefore, as a larger potential difference is generated between the heated thermoelectric element and the cooled thermoelectric element, the generation of the electric energy may be efficiently performed.

Meanwhile, according to the exemplary embodiment of the present invention, in the thermoelectric generating unit 10 according to the exemplary embodiment of the present invention, the valve 20 is attached to the first exhaust gas gaskets 111 and 111' of the unit module 100 positioned outermost in a direction of the exhaust gas outlet pipe 3.

Figure 8:
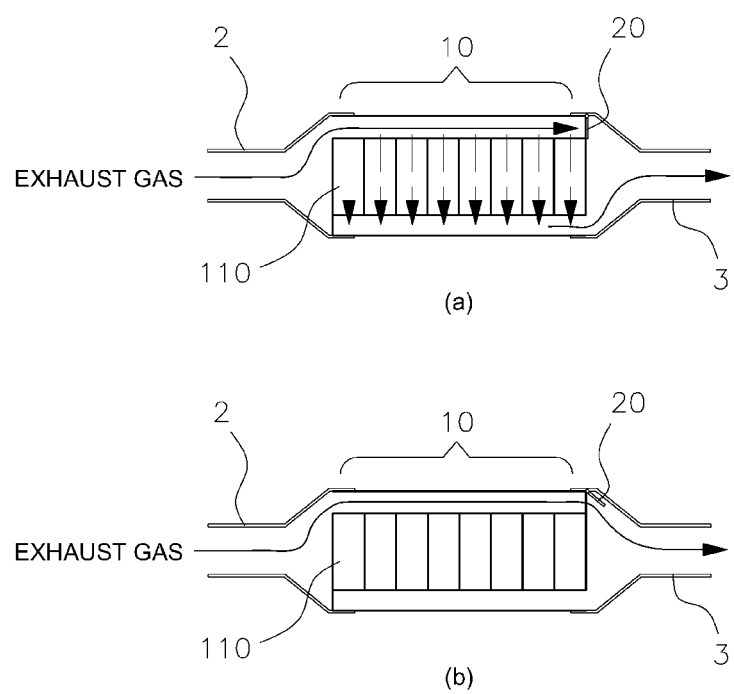
FIGS. 8A-B are cross-sectional schematic views illustrating heat exchange of the thermoelectric generator according to the exemplary embodiment of the present invention.

As illustrated in FIG. 8A, in the valve 20, the thermoelectric generation by the thermoelectric generating unit 10 is performed as the exhaust gas passes through the exhaust gas flow plate 110 when the valve 20 is closed, the exhaust gas flowing into the exhaust gas inlet pipe 2 is not discharged through the first exhaust gas gaskets 111 and 111' but instead is discharged only through the second exhaust gas gaskets 112 and 112'.

In contrast, as illustrated in FIG. 8B, when the valve 20 is opened, since the exhaust gas flowing into the exhaust gas inlet pipe 2 is discharged through both the paths through the first exhaust gas gaskets 111 and 111' and the second exhaust gas gaskets 112 and 112', a bypass operation is performed in which the thermoelectric generation of the thermoelectric generating unit 10 is partially limited. The bypass operation limits the thermoelectric generation to prevent overheating of the thermoelectric element due to high load driving.

The present invention is described with reference to the embodiments illustrated in the drawings, which are only example and can be implemented by various embodiments. Therefore, the true scope of the present invention will be defined only by claims.

What is claimed is:

1. A thermoelectric generator for a vehicle, comprising:
   a thermoelectric generating unit mounted between an exhaust gas inlet pipe through which exhaust gas flows within and an exhaust gas outlet pipe through which the exhaust gas is discharged, wherein the thermoelectric generating unit includes:
   a coolant inlet formed on one side thereof and a coolant outlet formed on another side thereof, the thermoelectric generating unit formed by assembling a plurality of unit modules having therein thermoelectric elements which generate a potential difference in accordance with heat exchange between the exhaust gas and the coolant performed by a process in which the exhaust gas flowing into the exhaust gas inlet pipe and the coolant flowing into the coolant inlet flow in directions perpendicular to each other,
   wherein a unit module of the plurality of unit modules includes:
   an exhaust gas flow plate which allows the exhaust gas to flow to a hollow inner space,
   a first pair of exhaust gas gaskets and a second pair of exhaust gas gaskets, which have formed therein exhaust gas through apertures allowing the exhaust gas flowing from the exhaust gas inlet pipe to flow inside the exhaust gas flow plate, are attached on left and right sides of the exhaust gas flow plate, respectively, and
   a first thermoelectric element is attached to a surface of the exhaust gas flow plate, and
   wherein in the unit module,
   a coolant flow plate, which allows the coolant to flow in the inner space, is attached to a surface of the first thermoelectric element,
   a first pair coolant gaskets and a second pair of coolant gaskets, which have coolant through apertures allowing the coolant flowing from the coolant inlet to flow inside the coolant flow plate, are attached on upper and lower sides of the coolant flow plate, respectively,
   a second thermoelectric element is attached to a surface of the coolant flow plate,
   bolt insertion apertures are formed on upper ends and lower ends of the first pair of exhaust gas gaskets and the second pair of exhaust gas gaskets, respectively, and bolt insertion apertures are formed at left and right sides of the first pair of coolant gaskets and the second pair of coolant gaskets, respectively.

2. The thermoelectric generator of claim 1, wherein
a valve is attached to the first pair of exhaust gas gaskets of the unit module positioned outermost in a direction of the exhaust gas outlet pipe of the thermoelectric generating unit, and
a bypass operation is performed in which the thermoelectric generation of the thermoelectric generating unit is partially limited by opening the valve.

3. The thermoelectric generator of claim 1, wherein
an exhaust gas blocking plate is formed at the first pair of exhaust gas gaskets positioned outermost in a direction of the exhaust gas inlet pipe, and
a coolant blocking plate is formed at the first pair of coolant gaskets positioned outermost in a direction of the exhaust gas inlet pipe.

4. A thermoelectric generator for a vehicle, comprising:
a thermoelectric generating unit mounted between an exhaust gas inlet pipe through which exhaust gas flows within and an exhaust gas outlet pipe through which the exhaust gas is discharged, wherein a potential difference in accordance with heat exchange between an exhaust gas and a coolant is generated by exhaust gas flowing into an exhaust gas inlet pipe and a coolant flowing into an coolant inlet flow in directions perpendicular to each other;
a unit module of a plurality of unit modules assembled to form the thermoelectric generating unit has an exhaust gas flow plate which allows the exhaust gas to flow to a hollow inner space,
a first pair of exhaust gas gaskets and a second pair of exhaust gas gaskets, which have formed therein exhaust gas through apertures allowing the exhaust gas flowing from the exhaust gas inlet pipe to flow inside the exhaust gas flow plate, are attached on left and right sides of the exhaust gas flow plate, respectively, and
a first thermoelectric element is attached to a surface of the exhaust gas flow plate, and
wherein in the unit module,
a coolant flow plate, which allows the coolant to flow in the inner space, is attached to a surface of the first thermoelectric element,
a first pair coolant gaskets and a second pair of coolant gaskets, which have coolant through apertures allowing the coolant flowing from the coolant inlet to flow inside the coolant flow plate, are attached on upper and lower sides of the coolant flow plate, respectively,
a second thermoelectric element is attached to a surface of the coolant flow plate,
bolt insertion apertures are formed on upper ends and lower ends of the first pair of exhaust gas gaskets and the second pair of exhaust gas gaskets, respectively, and
bolt insertion apertures are formed at left and right sides of the first pair of coolant gaskets and the second pair of coolant gaskets, respectively.

5. The thermoelectric generator of claim 4, wherein
a valve is attached to the first pair of exhaust gas gaskets of the unit module positioned outermost in a direction of the exhaust gas outlet pipe of the thermoelectric generating unit, and
a bypass operation is performed in which the thermoelectric generation of the thermoelectric generating unit is partially limited by opening the valve.

6. The thermoelectric generator of claim 4, wherein
an exhaust gas blocking plate is formed at the first pair of exhaust gas gaskets positioned outermost in a direction of the exhaust gas inlet pipe, and
a coolant blocking plate is formed at the first pair of coolant gaskets positioned outermost in a direction of the exhaust gas inlet pipe.

\* \* \* \* \*